US007098693B2

(12) United States Patent
Andresen et al.

(10) Patent No.: US 7,098,693 B2
(45) Date of Patent: Aug. 29, 2006

(54) BI-DIRECTIONAL VOLTAGE TRANSLATOR

(75) Inventors: Mark Elliot Andresen, Cary, NC (US); Robert Joseph Christopher, Chapel Hill, NC (US); James Joseph Parsonese, Cary, NC (US); William Roff Thomas, Cary, NC (US); Wilson Velez, Raleigh, NC (US); David Eduardo Vieira, Raleigh, NC (US); Menlo Wuu, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 10/930,091

(22) Filed: Aug. 31, 2004

(65) Prior Publication Data

US 2006/0044011 A1 Mar. 2, 2006

(51) Int. Cl.
 *H03K 19/0175* (2006.01)
(52) U.S. Cl. .......................................... 326/63; 326/80
(58) Field of Classification Search ............ 326/62–63, 326/75; 327/333
 See application file for complete search history.

(56) References Cited

U.S. PATENT DOCUMENTS

| 5,311,083 A | * | 5/1994 | Wanlass ....................... 326/68 |
| 5,521,531 A | * | 5/1996 | Okuzumi ...................... 326/81 |
| 5,657,324 A | * | 8/1997 | Itkin .......................... 370/276 |
| 5,877,633 A | | 3/1999 | Ng et al. |

* cited by examiner

*Primary Examiner*—James H. Cho
(74) *Attorney, Agent, or Firm*—J. Bruce Schelkopf; Dillon & Yudell LLP

(57) ABSTRACT

A bi-directional voltage translator is disclosed. The bi-directional voltage translator includes a step-up voltage translator for converting signals of a first voltage level to signals of a second voltage level, and a step-down voltage translator for converting signals of the second voltage level to signals of the first voltage level. The step-up voltage translator includes a first source sense circuit, a first block feedback circuit and a first output driver circuit. The step-down voltage translator includes a second source sense circuit, a second block feedback circuit and a second output driver circuit.

19 Claims, 3 Drawing Sheets

BI-DIRECTIONAL VOLTAGE TRANSLATOR

BACKGROUND OF THE INVENTION

1. Technical Field

The present invention relates to voltage translators in general, and, in particular, to bi-directional voltage translators. Still more particularly, the present invention relates to a bi-directional voltage translator for converting voltage levels between circuits having different voltage requirements.

2. Description of Related Art

The reduction in integrated circuit device dimensions on a wafer has necessitated the reduction in operating voltages of the integrated circuit devices to avoid latch-up and other reliability problems. With the current processing technology, complementary metal-oxide semiconductor (CMOS) devices generally operate at 3.3 volts or 2.5 volts, and there are efforts to reduce the operating voltages even further.

The operating voltages of legacy integrated circuit devices are generally higher than those of the newer generation integrated circuit devices. In order to couple integrated circuits having different operating voltages to each other, an interface, such as a voltage translator, is required to convert voltages between circuits with different operating voltages.

Prior art voltage translators are able to isolate a bus from its sub-bus(es), but are not able to pull down the output voltage to a lower offset. As a result, the offsets of prior art voltage translators are increased. Consequently, it is desirable to provide an improved voltage translator having an isolation occurred between a bus and its sub-bus(es) such that the output voltage can be shunted to a lower offset.

SUMMARY OF THE INVENTION

In accordance with a preferred embodiment of the present invention, a bi-directional voltage translator includes a step-up voltage translator for converting signals of a first voltage level to signals of a second voltage level, and a step-down voltage translator for converting signals of the second voltage level to signals of the first voltage level. The step-up voltage translator includes a first source sense circuit, a first block feedback circuit and a first output driver circuit. The step-down voltage translator includes a second source sense circuit, a second block feedback circuit and a second output driver circuit.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
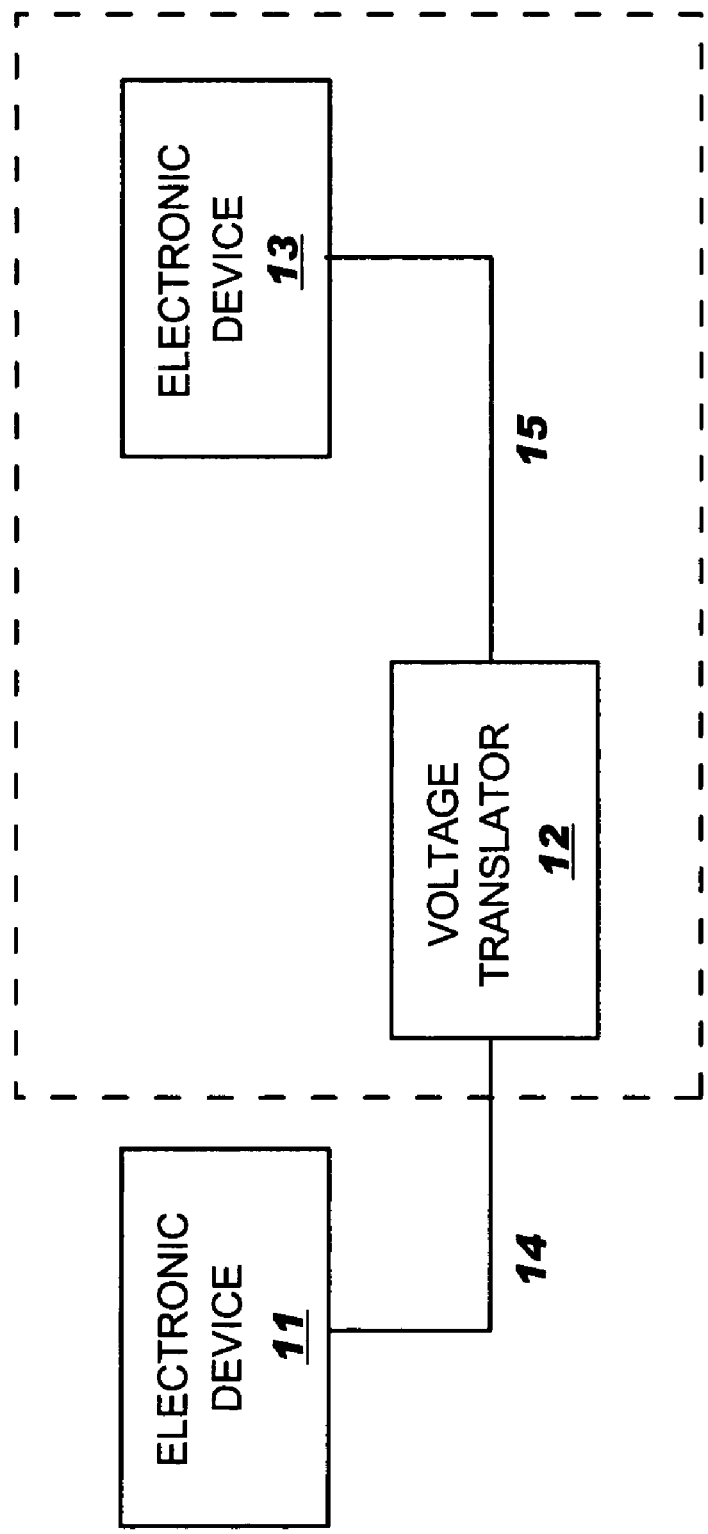
FIG. 1 is a block diagram of an electronic system employing a bi-directional voltage translator, in accordance with a preferred embodiment of the present invention.

Referring now to the drawings and in particular to FIG. 1, there is depicted a block diagram of an electronic system employing a bi-directional voltage translator, in accordance with a preferred embodiment of the present invention. As shown, an electronic system 10 includes an electronic device 11, a bi-directional voltage translator 12 and an electronic device 13. Each one of electronic devices 11, 13 can be any one of following electronic devices such as a cellular telephone, a cellular base station, a two-way radio, a pager, a personal digital assistant, a computer, a modem, a subscriber identity module (SIM) card, a SIM card reader, a smart card, a smart card reader, a battery charger, etc.

Electronic device 11 is detachably coupled to bi-directional voltage translator 12 via a wire 14. Electronic device 13 is detachably coupled to bi-directional voltage translator 12 via a wire 15. Bi-directional voltage translator 12 allows electronic devices 11, 13 to communicate over wires 14, 15, which form a single bi-directional wire without using a separate direction control line to the translation, such as a translation read/write control line.

Electronic device 11 operates at a first voltage level, and wire 14 transfers electrical signals at the first voltage level. Electronic device 13 operates at a second voltage level, and wire 15 transfers electrical signals at the second voltage level. For example, electronic device 11 outputs signals having the first voltage level on wire 14. Bi-directional voltage translator 12 translates the voltage level of the signals to the corresponding second voltage level and couples the translated signals to electronic device 13 via wire 15. Conversely, electronic device 13 outputs signals having the second voltage level on wire 15. Bi-directional voltage translator 12 translates the voltage level of the signals to the corresponding first voltage level and couples the translated signals to electronic device 11 via wire 14.

Figure 2:
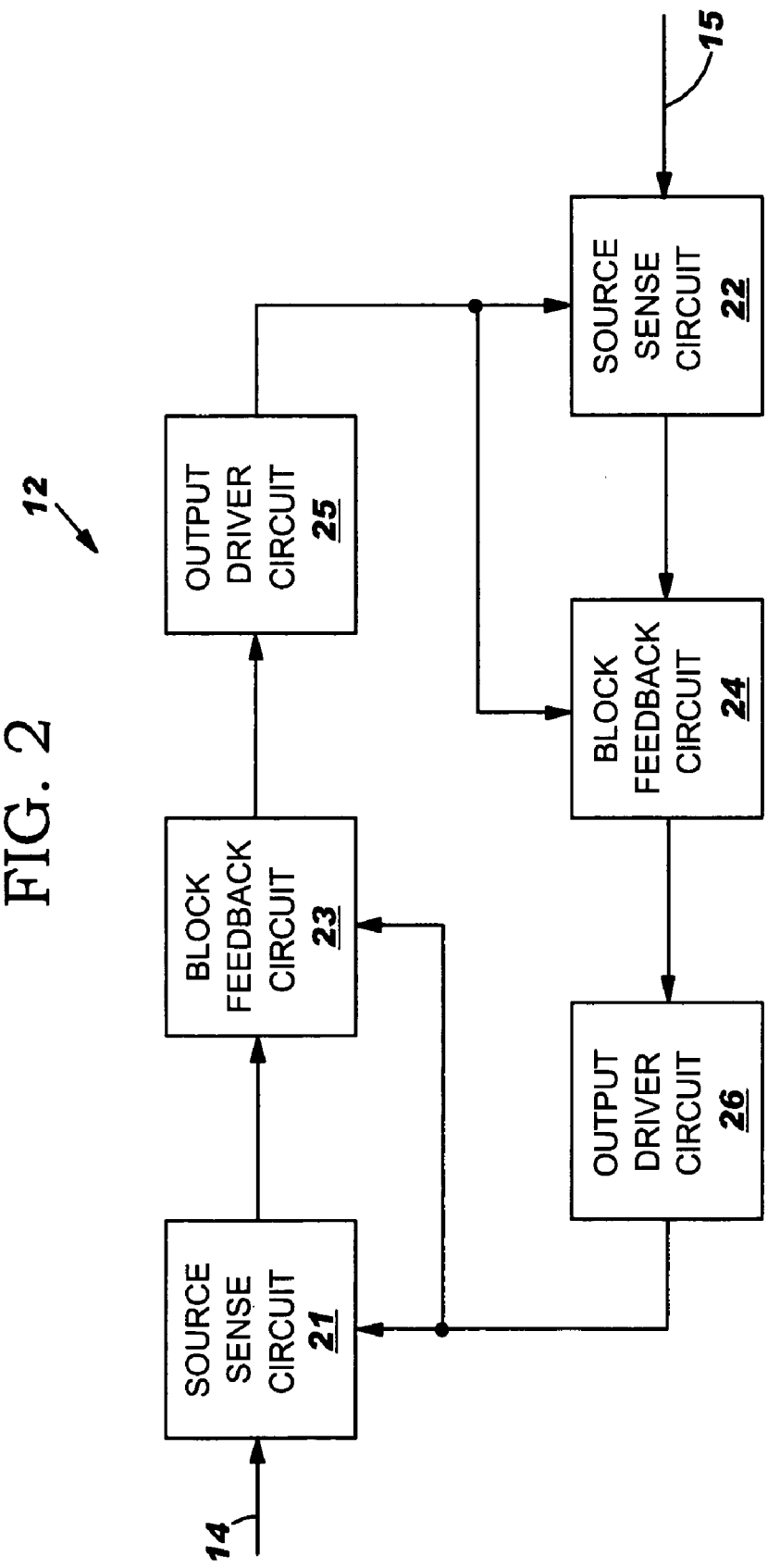
FIG. 2 is a block diagram of a bi-directional voltage translator within the electronic system from FIG. 1, in accordance with a preferred embodiment of the present invention.

With reference now to FIG. 2, there is depicted a block diagram of bi-directional voltage translator 12 within electronic system 10 from FIG. 1, in accordance with a preferred embodiment of the present invention. As shown, bi-directional voltage translator 12 includes source sense circuits 21–22, block feedback circuits 23–24 and output driver circuits 25–26. Source sense circuit 21, block feedback circuit 23 and output driver circuit 25 are connected to each other in series to translate signals having a first voltage level on wire 14 to corresponding signals having a second voltage level. Similarly, source sense circuit 22, block feedback circuit 24 and output driver circuit 26 are connected to each other in series to translate signals having the second voltage level on wire 15 to corresponding signals having the first voltage level. In the present embodiment, the first voltage level is 1.2 V and the second voltage level is 3.3 V.

Source sense circuit 21, block feedback circuit 23 and output driver circuit 25 are substantially identical to source sense circuit 22, block feedback circuit 24 and output driver circuit 26, respectively. Also, the connections among source sense circuit 21, block feedback circuit 23 and output driver circuit 25 mirror the connections among source sense circuit 22, block feedback circuit 24 and output driver circuit 26. Specifically, the output of source sense circuit 21 is fed to block feedback circuit 23, the output of block feedback circuit 23 is fed to output driver circuit 25, and the output of output driver circuit 25 is fed to source sense circuit 22 as well as block feedback circuit 24. Similarly, the output of source sense circuit 22 is fed to block feedback circuit 24, the output of block feedback circuit 24 is fed to output driver circuit 26, and the output of output driver circuit 26 is fed to source sense circuit 21 as well as block feedback circuit 23.

Figure 3:
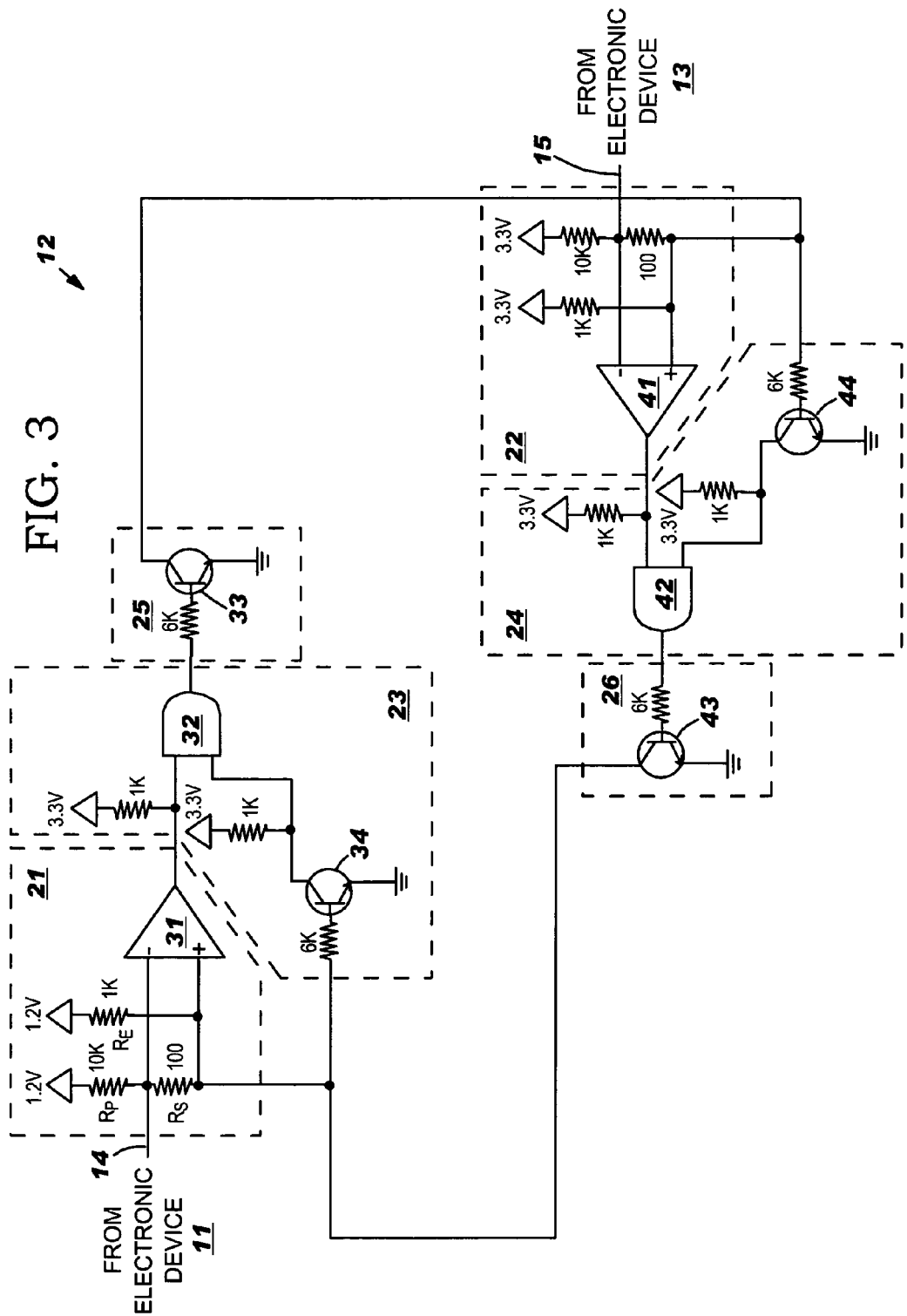
FIG. 3 is a circuit diagram of the bi-directional voltage translator from FIG. 2, in accordance with a preferred embodiment of the present invention.

Referring now to FIG. 3, there is depicted a circuit diagram of bi-directional voltage translator 12, in accordance with a preferred embodiment of the present invention. As shown, source sense circuit 21 includes a voltage comparator 31 and three resistors. Block feedback circuit 23 includes an AND gate 32, an NPN transistor 34 and three resistors. Output driver circuit 25 includes a transistor 33 and a resistor. Similarly, source sense circuit 22 includes a voltage comparator 41 and three resistors. Block feedback circuit 24 includes an AND gate 42, an NPN transistor 44 and three resistors. Output driver circuit 26 includes a transistor 43 and a resistor.

The two inputs of voltage comparator 31 are connected to wire 14, the base of transistor 34 and the collector of transistor 43. The inputs of AND gate 32 are connected to the output of voltage comparator 31 and the collector of transistor 34. The emitter of transistor 34 is connected to ground. The output of AND gate 32 is connected to the base of transistor 33. The emitter of transistor 34 is also connected to ground.

The inputs of voltage comparator 41 are connected to wire 15 and the base of transistor 44 as well as the collector of transistor 33. The inputs of AND gate 42 are connected to the output of voltage comparator 31 and the collector of transistor 44. The emitter of transistor 44 is connected to ground. The output of AND gate 42 is connected to the base of transistor 43. The emitter of transistor 34 is also connected to ground.

Because source sense circuit 21, block feedback circuit 23 and output driver circuit 25 are identical to source sense circuit 22, block feedback circuit 24 and output driver circuit 26, respectively, only source sense circuit 21, block feedback circuit 23 and output driver circuit 25 will be further explained in details. Source sense circuit 21 is the key to the operations of bi-directional voltage translator 12. Source sense circuit 21 serves two purposes. First, source sense circuit 21 detects a voltage across a resistor $R_s$. If the voltage across resistor $R_s$ is positive, then wire 14 is driven low by a device coupled to wire 14, and the output of voltage comparator 31 (S1) is active. However, if the voltage across resistor $R_s$ is negative, then wire 14 is driven by the output of output driver circuit 26 (out2), and the output of voltage comparator 31 (S1) is inactive.

The second purpose of source sense circuit 21 is to serve as a pull-up resistor (i.e., the combination of resistors $R_p$ and $R_s$) for wire 14 in order to meet the $V_{IH}$ ratings of any device attached to wire 14. The values for resistors $R_p$ and $R_s$ are selected to provide a voltage that is detectable by voltage comparator 31 and yet still allow the output of output driver circuit 26 (out2) to drive wire 14 with minimal current limiting and thus $V_{OL}$ lift on wire 14 that meets the $V_{IL}$ ratings of any device attached to wire 14. A resistor $R_b$ within source sense circuit 21 provides a current to make resistor $R_s$ negative if the output of output driver circuit 26 (out2) is driving wire 14. When neither an element on wire 14 nor the output of output driver circuit 26 (out2) is driving wire 14, then the voltage potential across resistor $R_s$ is zero, which results in the output of voltage comparator 31 being inactive.

Block feedback circuit 23 is basically a two-input AND gate having one inverting input. The inverting input is accomplished by transistor 34. The function of block feedback circuit 23 can be summarized in Table I.

TABLE I

| S1 | out2 | D1 | comments |
|---|---|---|---|
| 0 | x | 0 | no actively driving device on wire 14 or 15 |
| 1 | 1 | 1 | wire 14 has an actively driving device and wire 15 does not |
| 1 | 0 | 0 | both wires 14 and 15 have actively driving devices |

In Table I, S1 is the output of source sense circuit 21, out2 is the output of output driver circuit 26 and D1 is the output of block feedback circuit 23.

Output driver circuit 25 actively drives an output signal into source sense circuit 22. Specifically, transistor 33 within output driver circuit 25 sinks the current requirement for wire 15. The above-mentioned drive is conditional to the output of block feedback circuit 23 (D1) for driving the output of output driver circuit 25 (out1) low.

In addition to voltage translation, bi-directional voltage translator 12 can pull-down a signal and allow for lower $V_{input-low}$ requirements. For example, bi-directional voltage translator 12 has a translation between 3.3 V and 1.2 V. On the 1.2 V side of bi-directional voltage translator 12, electronic device 11 needs an $V_{input-low}$ of 200 mV. Such requirement cannot be met with the prior art voltage translators. Once the 3.3 V side of bi-directional voltage translator 12 drives, the signal will be translated and the signal will be pulled-down to approximately 175 mV. If the 1.2 V side of bi-directional voltage translator 12 drives, the 3.3 V side of bi-directional voltage translator 12 will be pulled-down to approximately 175 mV as well.

As has been described, the present invention provides an improved bi-directional voltage translator for converting voltage levels between circuits having different voltage requirements.

While the invention has been particularly shown and described with reference to a preferred embodiment, it will be understood by those skilled in the art that various changes in form and detail may be made therein without departing from the spirit and scope of the invention.

What is claimed is:

1. A bi-directional voltage translator comprising:
 a step-up voltage translator for converting signals of a first voltage level to signals of a second voltage level, wherein said step-up voltage translator includes
  a first source sense circuit;
  a first block feedback circuit; and
  a first output driver circuit having a transistor and a resistor; and
 a step-down voltage translator for converting signals of said second voltage level to signals of said first voltage level, wherein said step-down voltage translator includes
  a second source sense circuit;
  a second block feedback circuit; and
  a second output driver circuit.

2. The bi-directional voltage translator of claim 1, wherein said first source sense circuit outputs to said first block feedback circuit, said first block feedback circuit outputs to said first output driver circuit, and said first output driver circuit outputs to said second source sense circuit and said second block feedback circuit.

3. The bi-directional voltage translator of claim 1, wherein said second source sense circuit outputs to said second block feedback circuit, said second block feedback circuit outputs to said second output driver circuit and said second output driver circuit outputs to said first source sense circuit and said first block feedback circuit.

4. The bi-directional voltage translator of claim 1, wherein said first source sense circuit includes a voltage comparator and a plurality of resistors.

5. The bi-directional voltage translator of claim 1, wherein said first block feedback circuit includes an AND gate, a transistor and a plurality of resistors.

6. The bi-directional voltage translator of claim 1, wherein said second source sense circuit includes a voltage comparator and a plurality of resistors.

7. The bi-directional voltage translator of claim 1, wherein said second block feedback circuit includes an AND gate, a transistor and a plurality of resistors.

8. The bi-directional voltage translator of claim 1, wherein said second output driver circuit includes a transistor and a resistor.

9. The bi-directional voltage translator of claim 1, wherein said first voltage level is 1.2 V and said second voltage level is 3.3 V.

10. A bi-directional voltage translator comprising:
   a step-up voltage translator connected to a wire for converting signals on said wire having a first voltage level to signals of a second voltage level, wherein said step-up voltage translator includes a first source sense circuit, a first block feedback circuit and a first output driver circuit, wherein said first source sense circuit detects a voltage across a resistor, and if a voltage across said resistor is positive, then said wire is driven low by a device coupled to said wire; and
   a step-down voltage translator for converting signals of said second voltage level to signals of said first voltage level, wherein said step-down voltage translator includes a second source sense circuit, a second block feedback circuit and a second output driver circuit wherein if said voltage across said resistor is negative, then said wire is driven by said second output driver circuit.

11. The bi-directional voltage translator of claim 10, wherein said first source sense circuit outputs to said first block feedback circuit, said first block feedback circuit outputs to said first output driver circuit, and said first output driver circuit outputs to said second source sense circuit and said second block feedback circuit.

12. The bi-directional voltage translator of claim 10, wherein said second source sense circuit outputs to said second block feedback circuit, said second block feedback circuit outputs to said second output driver circuit, and said second output driver circuit outputs to said first source sense circuit and said first block feedback circuit.

13. The bi-directional voltage translator of claim 10, wherein said first source sense circuit includes a voltage comparator and a plurality of resistors.

14. The bi-directional voltage translator of claim 10, wherein said first block feedback circuit includes an AND gate, a transistor and a plurality of resistor.

15. The bi-directional voltage translator of claim 10, wherein said first output driver circuit includes a transistor and a resistor.

16. The bi-directional voltage translator of claim 10, wherein said second source sense circuit includes a voltage comparator and a plurality of resistors.

17. The bi-directional voltage translator of claim 10, wherein said second block feedback circuit includes an AND gate, a transistor and a plurality of resistors.

18. The bi-directional voltage translator of claim 10, wherein said second output driver circuit includes a transistor and a resistor.

19. The bi-directional voltage translator of claim 10, wherein said first voltage level is 1.2 V and said second voltage level is 3.3 V.

* * * * *